United States Patent
Wong et al.

(10) Patent No.: US 7,652,484 B2
(45) Date of Patent: Jan. 26, 2010

(54) SELF CALIBRATION APPARATUS AND METHODS

(75) Inventors: Kenneth H. Wong, Santa Rosa, CA (US); James C. Liu, Santa Rosa, CA (US); Keith F. Anderson, Santa Rosa, CA (US); Bobby Y. Wong, Stockton, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 328 days.

(21) Appl. No.: 11/677,710

(22) Filed: Feb. 22, 2007

(65) Prior Publication Data

US 2008/0204039 A1     Aug. 28, 2008

(51) Int. Cl.
*G01R 35/00* (2006.01)
*G01D 18/00* (2006.01)

(52) U.S. Cl. ............... 324/601; 324/638; 324/642; 702/85

(58) Field of Classification Search ........... 324/601, 324/638

See application file for complete search history.

(56) References Cited

U.S. PATENT DOCUMENTS 5,578,932 A * 11/1996 Adamian ............... 324/601
6,147,501 A * 11/2000 Chodora ............... 324/601
6,417,674 B1 * 7/2002 Rowell et al. ........... 324/601
6,920,407 B2 * 7/2005 Adamian et al. ......... 702/104
7,019,536 B1 * 3/2006 Anderson et al. ........ 324/601
7,068,046 B2 * 6/2006 Martens et al. ......... 324/601
7,124,049 B2 * 10/2006 Wong et al. ............. 702/107

* cited by examiner

*Primary Examiner*—Timothy J Dole
*Assistant Examiner*—John Zhu (57) ABSTRACT

In one method of calibrating an instrument having N ports, where N>=2, cables of a first type are characterized by connecting a first cable between two of the ports; performing an "unknown-thru" full two-port calibration between the two ports; obtaining a S-parameter of the first cable; saving the S-parameter of the first cable; and then repeating the connecting, performing, obtaining and saving for additional cables having the first type. The cables having the first type are then disconnected from one of the two ports and a measurement plane is transferred from the connected end of the cable to the disconnected end of the cable. Cables of a second type are then characterized by connecting a second cable between the second of the two ports and the disconnected end of the first cable; measuring a S-parameter of the second cable; and saving the S-parameter of the second cable.

12 Claims, 10 Drawing Sheets

Measure Cable(s), cable-1, cable-2
Between Ports — Unknown Thru Method

SELF CALIBRATION APPARATUS AND METHODS

BACKGROUND

Figure 1:
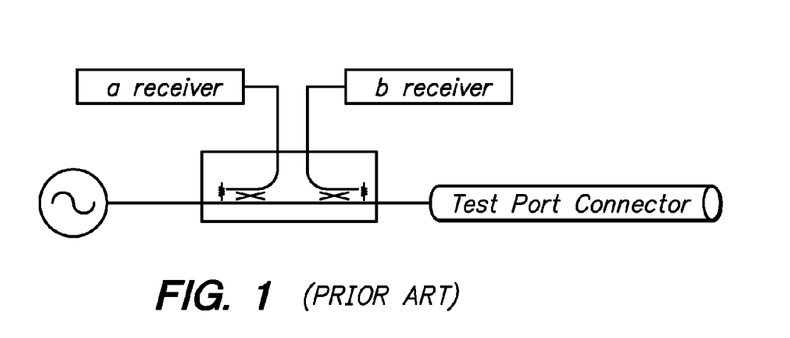
FIG. 1 illustrates a prior art 1 port reflectometer.
Figure 2:
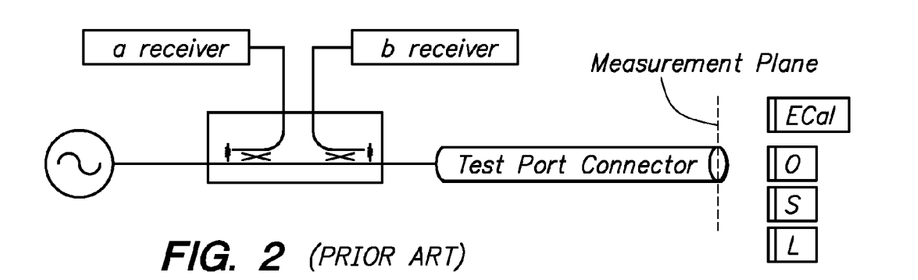
FIG. 2 illustrates a prior art method for calibrating the measurement plane.

FIG. 1 illustrates a prior art 1 port reflectometer. Typical network analyzer calibrations require several standards to be measured at the measurement plane to determine the systematic error coefficients (shown in FIG. 2). Subsequently the calibration devices are removed and set aside while the network analyzer measures the device of interest. Electronic calibration (ECal) simplifies the calibration process by providing a single connection per analyzer port for calibration. Upon completion of the error correction process the ECal device is removed.

Adamien performs automatic calibration of a vector network analyzer (VNA) using multi-state electronic transfer standards inside the test ports of a VNA, behind the reflectometer and applying the "unknown thru" calibration method. A variant prior art method automatically calibrates a VNA with a electronically switchable open, short load standards places behind the test ports and before the reflectometer. The "unknown thru" method may be used to obtain a full 2-port calibration. Neither method allows the system to be configured to measure insertables and non-insertables without additional calibration standards.

Figure 3:
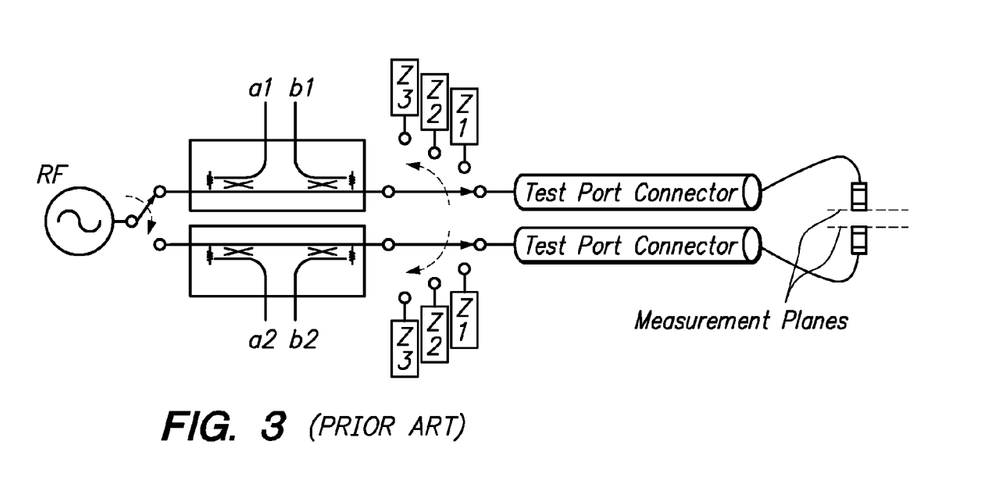
FIG. 3 illustrates a prior art 2-port vector network analyzer with internal electronic calibration devices plus an external 2-port full 2-port calibration.

U.S. Pat. No. 6,417,674 expanded the "unknown thru" method for multi-port calibration. An initial calibration at the measurement plane using traditional methods is performed. The internal electronic calibration devices are then measure and corrected using the systematic error coefficients obtained from the initial external calibration (shown in FIG. 3). Thus, automatic calibration of the measurement port is performed using the internal electronic calibration devices. Unfortunately, the transmission error coefficients are obtained by using a full 2 port Short-Open-Load-Thru (SOLT) calibration. Due to operating environment conditions, e.g. temperature, movement, age, cables and interconnects often require periodic calibration to maintain accuracy. This technique is not suited for portable instrumentation.

SUMMARY

Vector Network Analyzer calibrations require measuring a minimum of three distinct and known reflection states to derive the systematic errors behind a test port. The derived systematic error coefficients are then used to correct measurement errors and thereby improve measurement accuracy.

For two port measurements, as through connection between ports 1 and 2 is required to obtain the transmission systematic errors. The instrument performs these calibration steps without an external calibration kit or standards to save time and cost. This is useful for portable equipment that may be transported. By incorporating a multi-state impedance module inside a network analyzer behind each test port, and then transferring an external calibration to the multi-state impedance module, the network analyzer can automatically calibrate each port using the characterized internal multi-state impedance module. By using the appropriate combinations of cables and adapters, the unknown-thru calibration method, full two port calibrations for insertable and non-insertable measurements are possible without additional calibration standards. The multi-state impedance module can be configured to be a variable impedance termination for the test port so that is can be used as an external electronic calibration device for other network analyzers or as a variable impedance termination for device measurements or as a verification device.

DETAILED DESCRIPTION

The present invention is a method to allow a vector network analyzer (VNA) to self calibrate without the addition of calibration standards, e.g. a calibration kit with a network analyzer.

Figure 4:
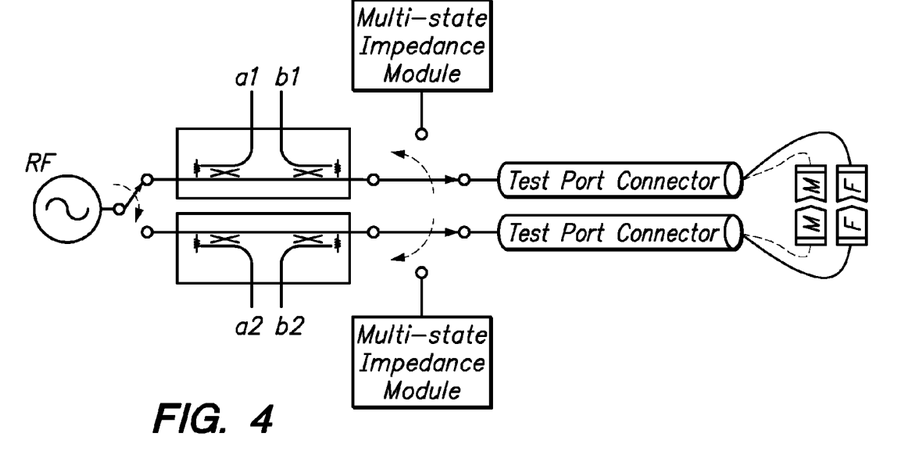
FIG. 4 illustrates a configuration suitable for the present invention.

FIG. 4 illustrates self-calibration for a typical VNA with insertable and non insertable Devices Under Test (DUT). The RF source can switch between two cables. For each cable, a reflectometer interposes the switch, a multi-state impedance module, and a test port connector.

The method provides a full 2-port error corrected measurement of insertable and non-insertable devices. The test port cables can be characterized at any time and therefore cable drift error is eliminated. The instrument may be refreshed, e.g. re-calibrated, at any time using the internal standards.

Figure 8:
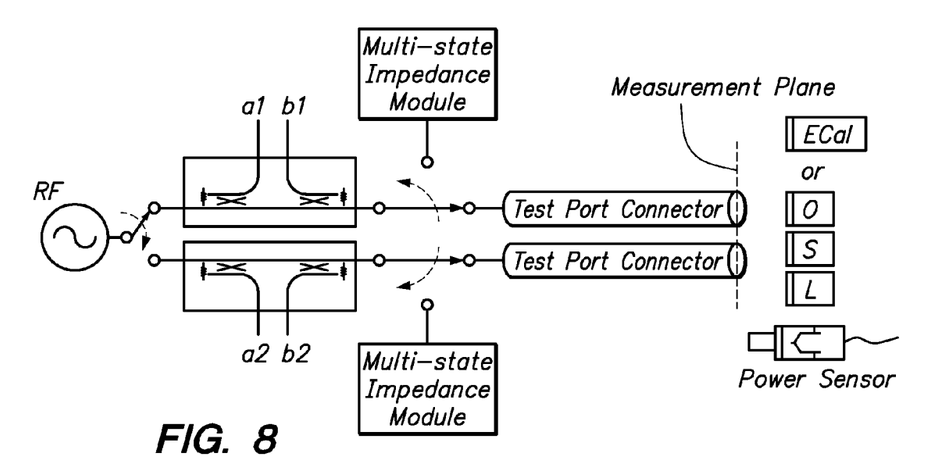
FIG. 8 shows two one-port calibrations performed at the test port measurement plane.

Instead of a full 2-port calibration with the cables, two one-port calibrations are performed at the test port measurement plane, see FIG. 8. For measurement flexibility, the test port connectors should be the same gender (or noninsertable) of the same connector family. Insertable combinations and mixed connector family combination limit the self calibration feature to male and female connector combinations.

FIGS. 9 through 13 show the self-calibration steps and possible device connector combinations.

Figure 6:
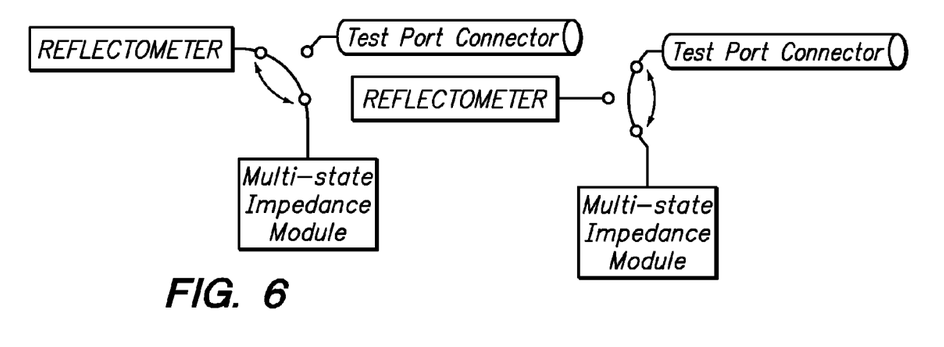
Figure 7:
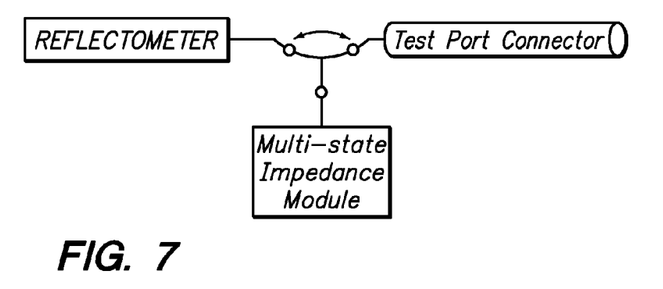

FIG. 6 illustrates another embodiment of the invention. For simplicity, only one port is illustrated. In this embodiment, the multi-state impedance module can be switched to the reflectometer side or the test port side. The switch can also connect the reflectometer directly to the test port. When the multi-state impedance module is switched to the reflectometer side, it functions as an internal calibration device. When it is switched to the test port side, it can be used as an external VNA calibration device or verification device. When connected as shown in FIG. 7, it behaves as a variable impedance termination for device characterization.

Factory Calibration

Figure 18:
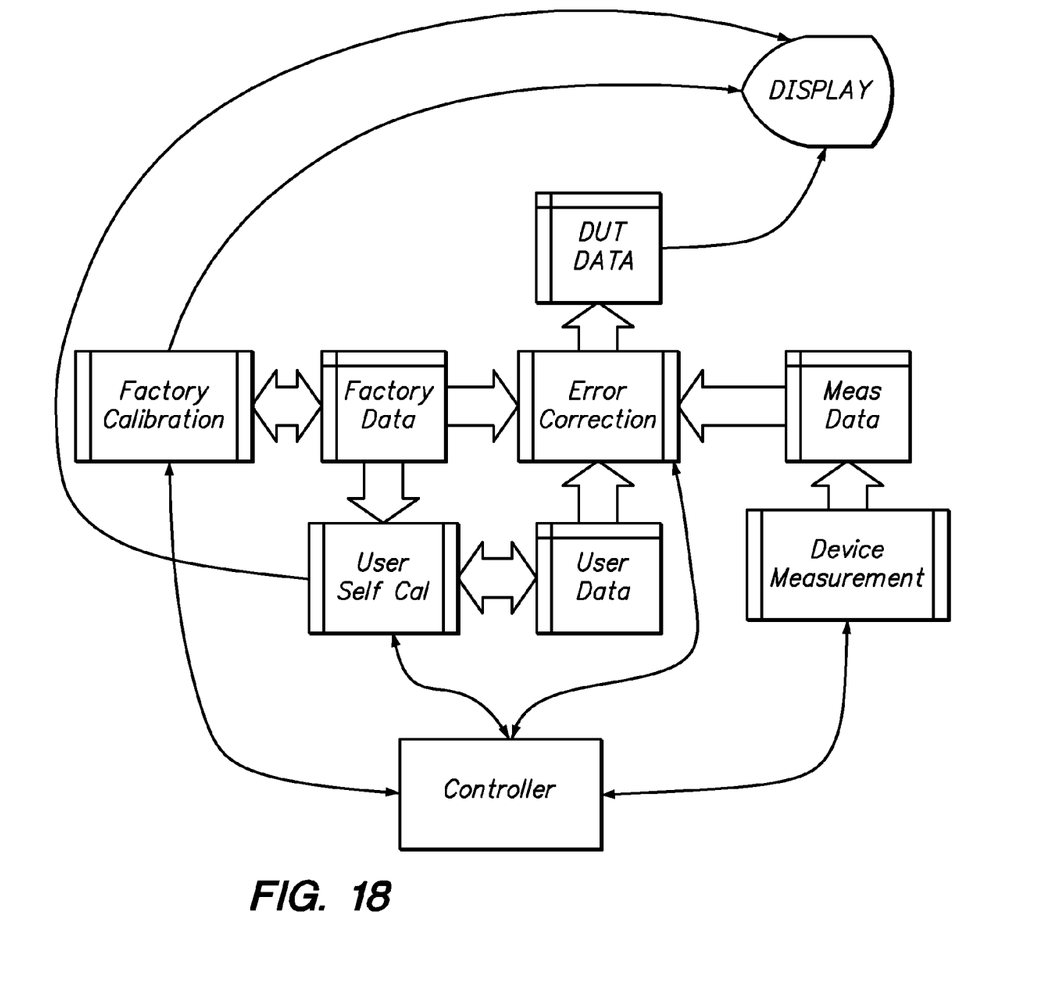
FIG. 18 is a simplified block diagram of the instrument data space and flow.

The instrument is designed for a factory calibration at the test ports' measurement planes using ECal or mechanical calibration standards. This calibration is then used to measure the internal multi-state impedance module or each port with error correction ON. The multi-state impedance can be used for verification and/or variable termination applications. The measured data of each impedance state is then saved to the instrument's internal dedicated factory memory space. With the test port calibration for reflection measurements, a power sensor can be connected to the test port as a reference to calibrate the "a" and "b" receivers for power measurement. The power calibration factor is saved in the allocated factory data memory space. The instrument is capable of making error corrected 1-port reflection measurements and power measurements without any additional calibration at power on. FIG. 18 shows a simplified block diagram of the instrument's data memory and process control relationships.

Figure 5:
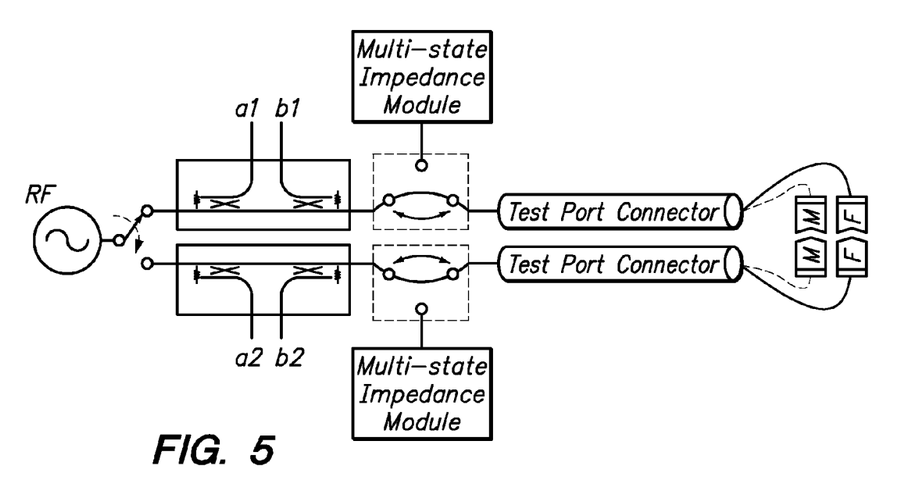
FIGS. 5-7 illustrate another configuration suitable for the present invention.
Figure 14:
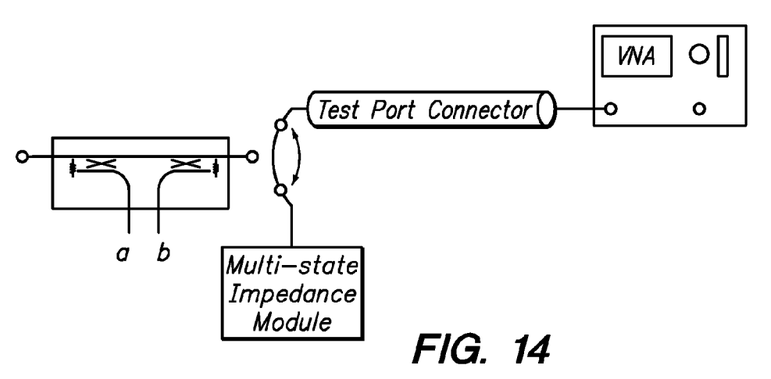
FIG. 14 illustrates an input side multi-state impedance module calibration.

For the instrument configuration shown in FIG. 5, an additional data set for the multi-state impedance module in series with the test port must be characterized and saved using a calibrated VNA (as shown in FIG. 14). This characterization data is saved in the factory data memory space.

Figure 15:
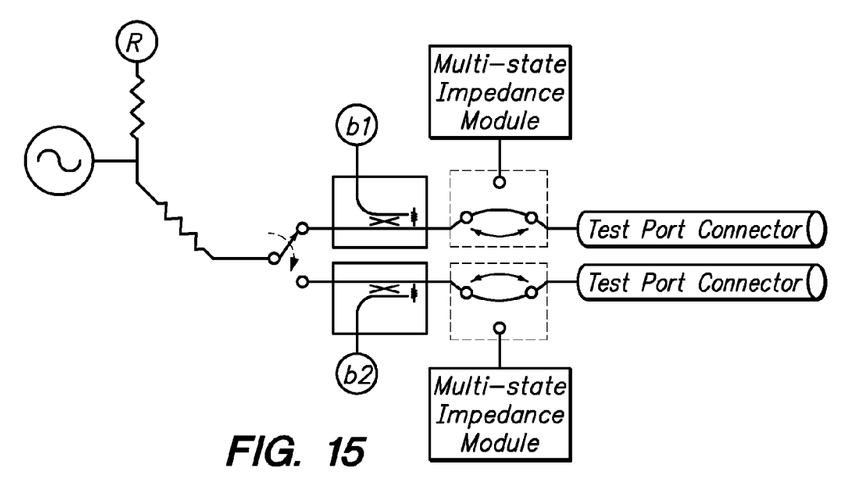
FIG. 15 illustrates a single reference receiver configuration.

Some low cost VNA design use only one reference receiver for both forward and reverse measurements. Instead of having a1 and a2 receivers, one REF receiver is used instead (as shown in FIG. 15). The multi-function switch configuration offers other self-calibration options for this arrangement.

Figure 16A:
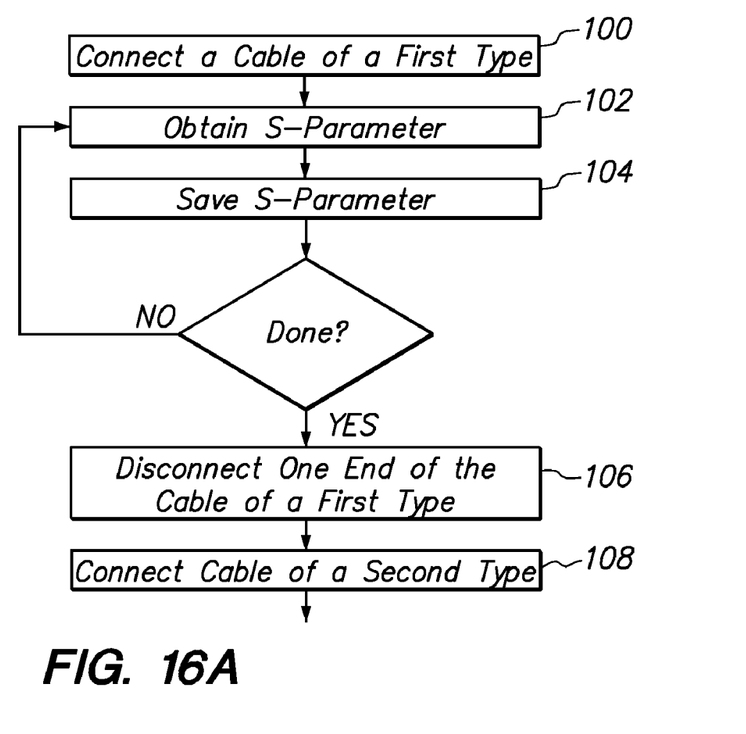
FIGS. 16A-B illustrate a process flowchart for user calibration.
Figure 16B:
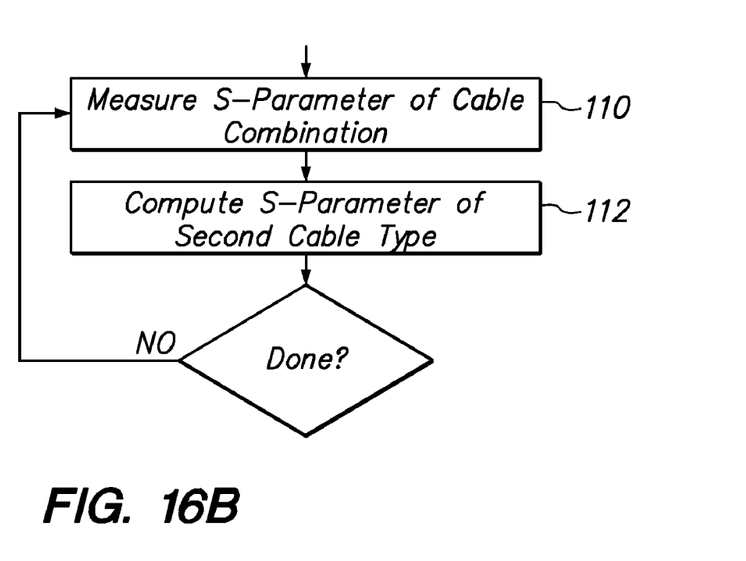

FIGS. 16A-B illustrate a process flowchart for user calibration. If two-port device measurements are required, cables are needed to connect the test ports to the device under test (DUT). The following procedure will transfer the measurement plane from the test port connectors to the end of the cable(s) for a full two port calibration without any calibration standards.

Figure 9:
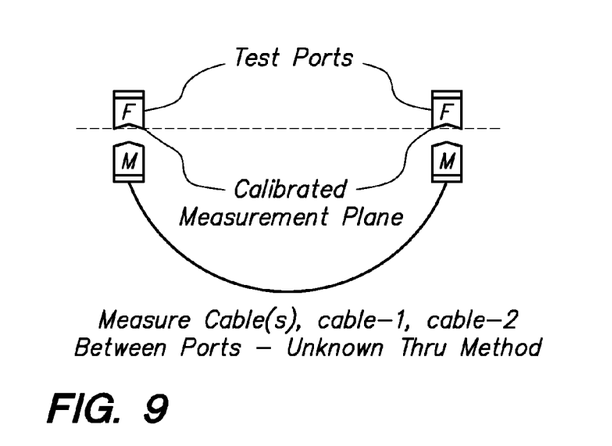
FIGS. 9-13 illustrate the self-calibration steps and alternate device connector combinations.

In step 100, connect an appropriate cable, with mateable connectors to the instrument ports and adequate length, between the calibrated ports and perform an "unknown-thru" full two-port calibration. To illustrate, when the test port connectors are both "female" connectors, the cables will have "male" connectors on both ends (as shown in FIG. 9).

In step 102, without removing the cable, obtain the S-parameter of the cable. For notational convenience, this will be Cable 1.

In step 104, save the S-parameter of the cable in the instrument's internal dedicated user memory space.

Optionally repeat steps 102 and 104 for additional cables, e.g. Cable 2, having the same configuration as Cable 1.

In step 106, disconnect one end of Cable 1 from one of the test ports.

Figure 10:
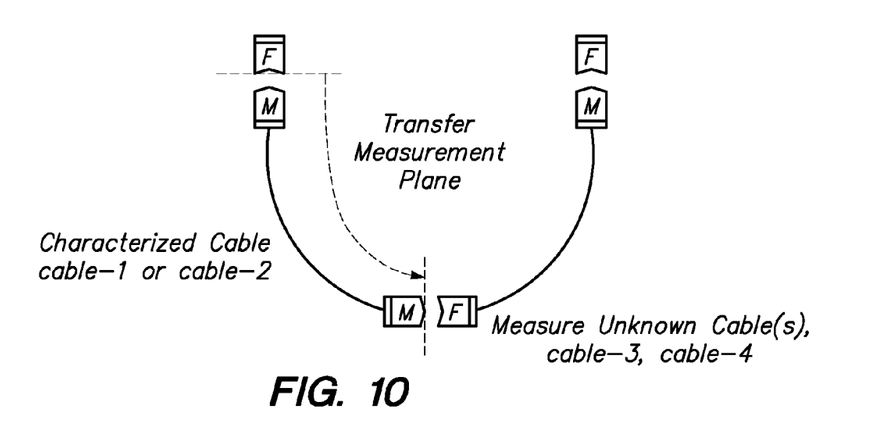

In step 108, connect an appropriate second cable type, with mateable connects to the instrument test port and to the open connector of Cable 1, to the opened test port and Cable 1. Since the test port connector is female and the Cable 1 end connector is male, this cable should have a male connector on one end and a female connector on the other end (as shown in FIG. 10).

In step 110, measure the S-parameter of the first plus second cable type.

In step 112, compute the S-parameter of the second cable by de-embedding the first cable's data from the combined measurement. Save the data in the instrument's internal dedicated user memory space. For notational convenience, call this Cable 3.

Optionally repeat steps 110 and 112 for additional cables, e.g. Cable 4, having the same configuration as Cable 3.

Figure 11:
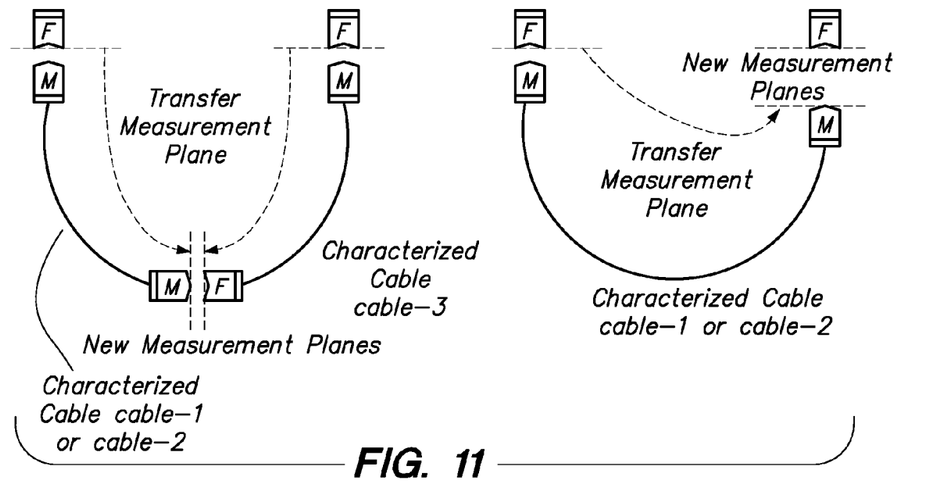

By selecting the appropriate cables, full two-port error corrected measurements can be performed at the end off the cables (as shown in FIG. 11).

Additional characterized cables will allow the measurement of devices in any of the following connector gender combinations:

Cable 1 and Cable 3 combination provides female to male (as shown in FIG. 11)

Figure 12:
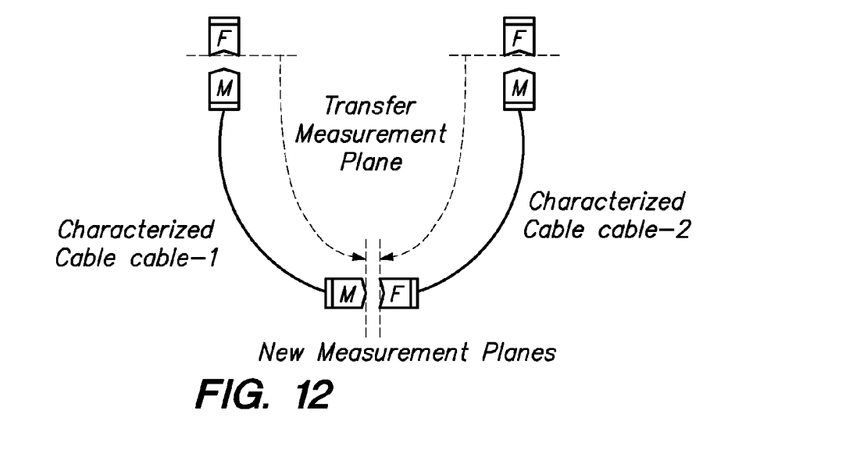

Cable 3 and Cable 4 combination provides male to male device measurements (as shown in FIG. 12)

Figure 13:
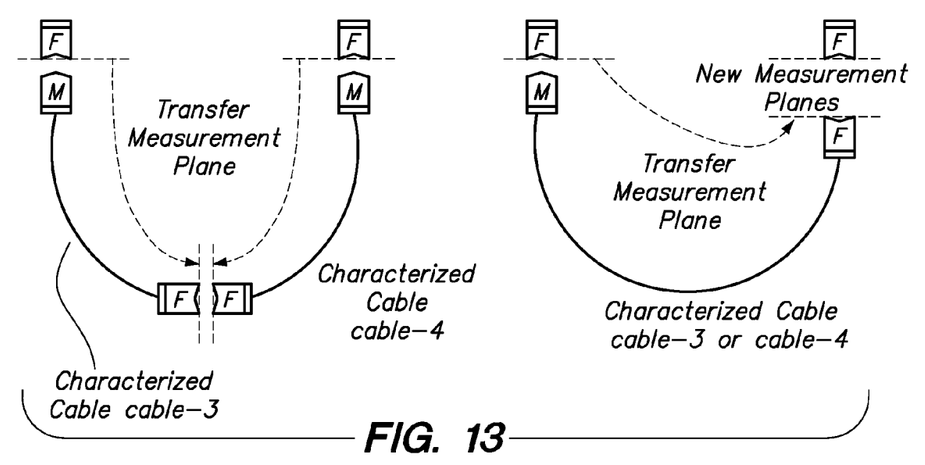

Cable 1 and Cable 2 combination provide female to female device measurements (as shown in FIG. 13)

The device measurement can be performed at any of the steps that cables are being measured. Step 2 was used to characterize a cable. It can be used to measure any two port device with similar features, connectable between port-1 and port-2. The same may be said about step 6. If the DUT can be connected to the test port connector directly, only one cable is required.

For a single reference receiver system (as shown in FIG. 15), a two-port calibration maybe accomplished by using the port-1 internal multi-state impedance module as calibration device for port-2 with the cable connected. If the instrument's test port connectors are the same kind, the port numbers used in the following self-calibration procedure are interchangeable. Assume the test ports are automatically calibrated, 1-port calibration, at instrument turn-on.

Figure 17:
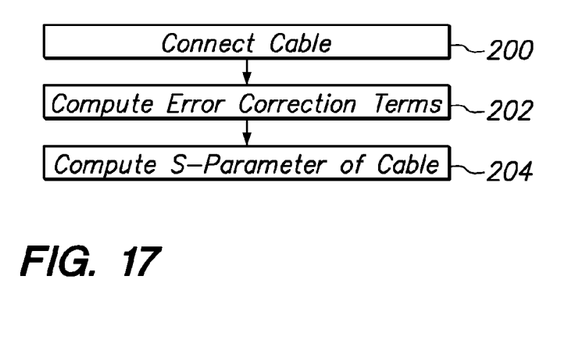
FIG. 17 illustrates a process flowchart for calibrating a single reference receiver system.
Figure 19:
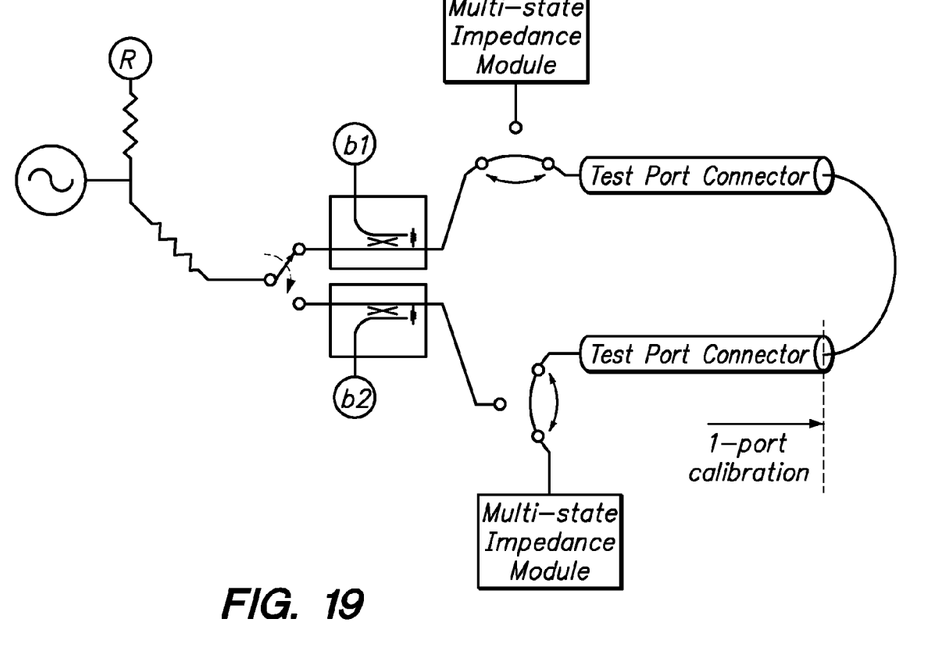
FIG. 19 illustrates an internal multi-state impedance module as an external calibrator.
Figure 20:
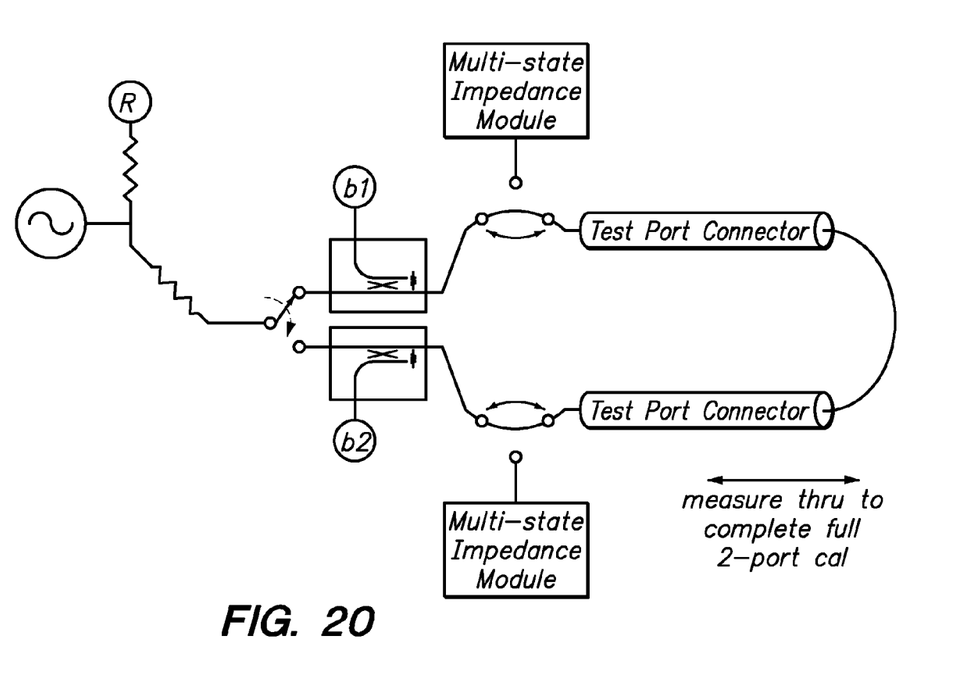
FIG. 20 illustrates forward and reverse thru measurements for the system shown in FIG. 19.

FIG. 17 illustrates a process flowchart for the single reference receiver system shown in FIG. 15. In step 200, connect an appropriate cable, with mate-able connectors to the instruments ports and adequate length, between the calibrated ports. Select a port, e.g. port-1, to perform a full two-port calibration using the SOLT method. The instrument's controller will perform the following steps in a manner invisible to the user. First, a one-port calibration will be performed at the end of the cable connector mating plane by using the instrument's internal multi-state impedance model as an external calibration device (as shown in FIG. 19). Second, a forward and reverse thru measurement are made (as shown in FIG. 20).

In step 202, compute 12 error correction terms. The instrument is read to make insertable two-port measurements at this point.

In step 204, compute the S-parameter of the cable by de-embedding the internal one-port calibration at port 2 from the one-port calibration performed at port 1. Transfer transmission tracking and load match terms to port 2.

Figure 22:
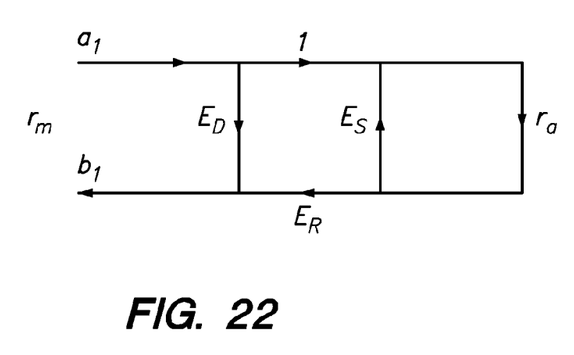
FIG. 22 illustrates a one port vector network analyzer.

For a 1-port VNA error model (shown in FIG. 22), the three systematic error are directivity ($E_D$), source match ($E_S$), and reflection tracking ($E_R$). By measuring at least three distinctly different known devices, the systematic error can be determined in matrix least squares equation form:

$$\begin{bmatrix} E_D \\ E_S \\ E_S E_D - E_R \end{bmatrix} \begin{bmatrix} 1 & \Gamma_{m1}\Gamma_{a1} & -\Gamma_{a1} \\ 1 & \Gamma_{m2}\Gamma_{a2} & -\Gamma_{a2} \\ 1 & \Gamma_{m3}\Gamma_{a3} & -\Gamma_{a3} \end{bmatrix}^{-1} \begin{bmatrix} \Gamma_{m1} \\ \Gamma_{m2} \\ \Gamma_{m3} \end{bmatrix} \quad \text{Equation 1}$$

where $\Gamma_{mn}$ is the measured reflection of the n-th device, and $\Gamma_{an}$ is the actual reflection of the n-th device.

If more than three impedance states are available for calibration, the least squares solution is used.

$$\begin{bmatrix} 1 & \Gamma_{m1}\Gamma_{a1} & -\Gamma_{a1} \\ 1 & \Gamma_{m2}\Gamma_{a2} & -\Gamma_{a2} \\ 1 & \Gamma_{m3}\Gamma_{a3} & -\Gamma_{a3} \\ \vdots & \vdots & \vdots \\ 1 & \Gamma_{mn}\Gamma_{an} & -\Gamma_{an} \end{bmatrix} \cdot \begin{bmatrix} E_D \\ E_S \\ E_S E_D - E_R \end{bmatrix} = \begin{bmatrix} \Gamma_{m1} \\ \Gamma_{m2} \\ \Gamma_{m3} \\ \vdots \\ \Gamma_{mn} \end{bmatrix} \Rightarrow [A]*[E] \quad \text{Equation 2}$$

$$= [M]$$

$$[E] = \{[A]^H [A]\}^{-1} [A]^H [M]$$

Figure 23:
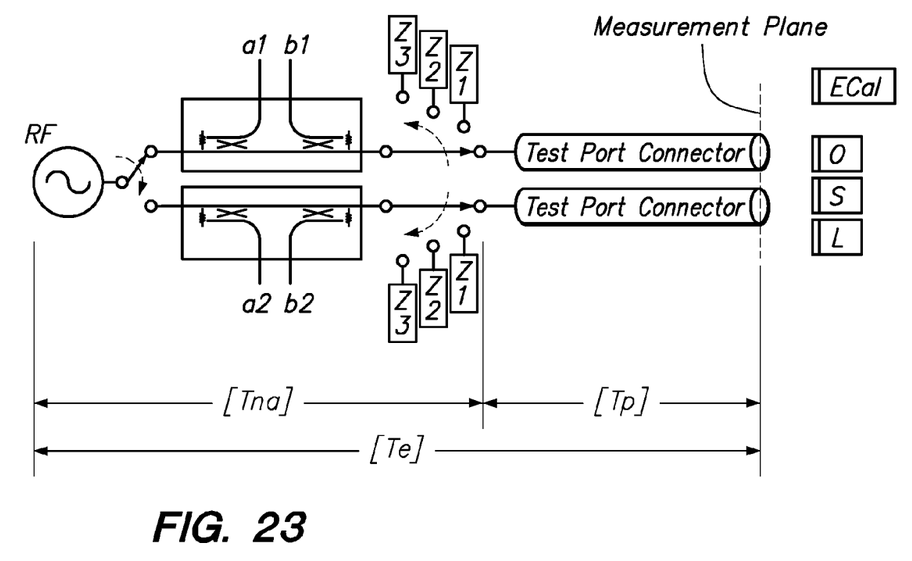
FIG. 23 illustrates a physical set up for FIG. 21.

Using the physical set-up shown in FIG. 23. Let $$[T_e] = E \begin{bmatrix} E_S E_D - E_R & E_D \\ -E_S & 1 \end{bmatrix} = [T_{na}]*[T_p] \quad \text{Equation 3}$$

$[T_{na}]$ is the transmission parameter of systematic error of the system behind the switch.

$$[T_{na}] = E \begin{bmatrix} E_S^{na} E_D^{na} - E_R^{na} & E_D \\ -E_S^{na} & 1 \end{bmatrix}$$

$[T_p]$ is the transmission parameter of systematic errors of the system between the measurement plane and the switch.

$$[T_p] = E \begin{bmatrix} E_S^p E_D^p - E_R^p & E_D \\ -E_S^p & 1 \end{bmatrix} \quad \text{Equation 4}$$

Then $$\begin{bmatrix} b' \\ a' \end{bmatrix} = [T_e]*\begin{bmatrix} \Gamma_{SE} \\ 1 \end{bmatrix} = [T_{na}]*[T_p]*\begin{bmatrix} \Gamma_{SE} \\ 1 \end{bmatrix}$$

$\Gamma_{SE}$ is the reflection of external standard.

$$\begin{bmatrix} \Gamma_{SE} \\ 1 \end{bmatrix} = [T_p]^{-1} * [T_{na}]^{-1} * \begin{bmatrix} b \\ a \end{bmatrix} \quad \text{Equation 5}$$

With the switch set to measure the internal calibration standards $$\begin{bmatrix} b' \\ a' \end{bmatrix} = [T_{na}] * \begin{bmatrix} \Gamma_{SI} \\ 1 \end{bmatrix} \quad \text{Equation 6}$$

$\Gamma_{SI}$ is the actual response of the standard.

With error correction ON, using $[T_O]$ $$\begin{bmatrix} \Gamma'_{SI} \\ 1 \end{bmatrix} = \quad \text{Equation 7}$$

$$[T_e]^{-1} * \begin{bmatrix} b' \\ a' \end{bmatrix} = [T_e]^{-1} * [T_{na}] * \begin{bmatrix} \Gamma_{SI} \\ 1 \end{bmatrix} = [T_P]^{-1} * \begin{bmatrix} \Gamma_{SI} \\ 1 \end{bmatrix}$$

The actual response of the standard is equal to the "error corrected" $\Gamma_{SI}'$ with the front end's systematic errors embedded. Applying the "error corrected" data $\Gamma_{SI}'$ of each internal calibration device to the 1-port calibration solution:

$$\begin{bmatrix} b' \\ a' \end{bmatrix} = [T_{na}] * \begin{bmatrix} \Gamma_{SI} \\ 1 \end{bmatrix} = [T_{na}]*[T_P] * \begin{bmatrix} \Gamma'_{SI} \\ 1 \end{bmatrix} \quad \text{Equation 8}$$

$$\begin{bmatrix} b' \\ a' \end{bmatrix} = [T_e] * \begin{bmatrix} \Gamma'_{SI} \\ 1 \end{bmatrix} \quad \text{Equation 9}$$

This is exactly the same form as equation (4) and consistent with equation (7). The external calibration was transferred to the internal calibration standards and thereby they appeared to have been measured at the measurement plane. The external calibration may be performed by the instrument's manufacturer or by the end user's calibration lab or by the end user.

The instrument can be designed to perform a calibration using the internal characterized devices at each port during power up and at any time desired. With a cable connecting port-1 to port-2, a full 2-port calibration, at the measurement planes now can be accomplished using the unknown thru method.

With characterized cables and adapters, error corrected measurement of devices is now possible using de-embedding techniques or measurement plane transfer technique using full S-parameter data of the cables and adapters. Either method will achieve the same results.

After a full 2-port measurement error correction, the result is equivalent to the matrix product of the transmission matrix of each component. Applying the 2-port de-embedding technique:

$$[T_{mc}] = [T_{c1}] * [T_D] * [T_{c2}] \quad \text{Equation 10}$$

Matrix $[T_{mc}]$ corresponds to the error corrected T-matrix. Matrix $[T_D]$ corresponds to the T matrix of the DUT. Matrices $[T_{c1}]$, $[T_{c2}]$ corresponds to the T matrices of the cables on port-1 and port-2 respectively.

$$[T] = \begin{bmatrix} T_{11} & T_{12} \\ T_{21} & T_{22} \end{bmatrix} = \left(\frac{1}{S_{21}}\right) \begin{bmatrix} \Delta S & T_{11} \\ -S_{22} & 1 \end{bmatrix} \quad \text{Equation 11}$$

where $\Delta S = S_{21} S_{12} - S_{11} S_{22}$ $$[S] = \begin{bmatrix} S_{11} & S_{12} \\ S_{21} & S_{22} \end{bmatrix} = \left(\frac{1}{T_{22}}\right) \begin{bmatrix} T_{12} & \Delta T \\ 1 & -T_{21} \end{bmatrix}$$

where $\Delta T = T_{11} T_{22} - T_{21} T_{12}$

The S-parameter of the DUT can be solved:

$$[T_D] = [T_{c1}]^{-1} * [T_{mc}] * [T_{c2}]^{-1} \quad \text{Equation 12}$$

To de-embed the cable's S parameter from two 1-port calibrations:

$$[T_{E2}]=[T_{E1}]*[T_C]; \therefore [T_C]=[T_{E1}]^{-1}*[T_{E2}]$$

$[T_{E2}]$ is the transmission parameter of 1-port calibration error terms at the end of the cable. $[T_C]$ is the transmission parameter of the cable with the input at the test port side. $[T_{E1}]$ is the transmission parameter of 1-port calibration error terms at test port at the other end of the cable.

The measurement plane at the instrument's test ports can be transferred to the end of the cables by recognizing the following relationships:

$$[T'_{E1}]=[T_{E1}]*[T_{c1}]; [T'_{E2}]=[T_{E2}]*[T'_{c2}]$$

Figure 21:
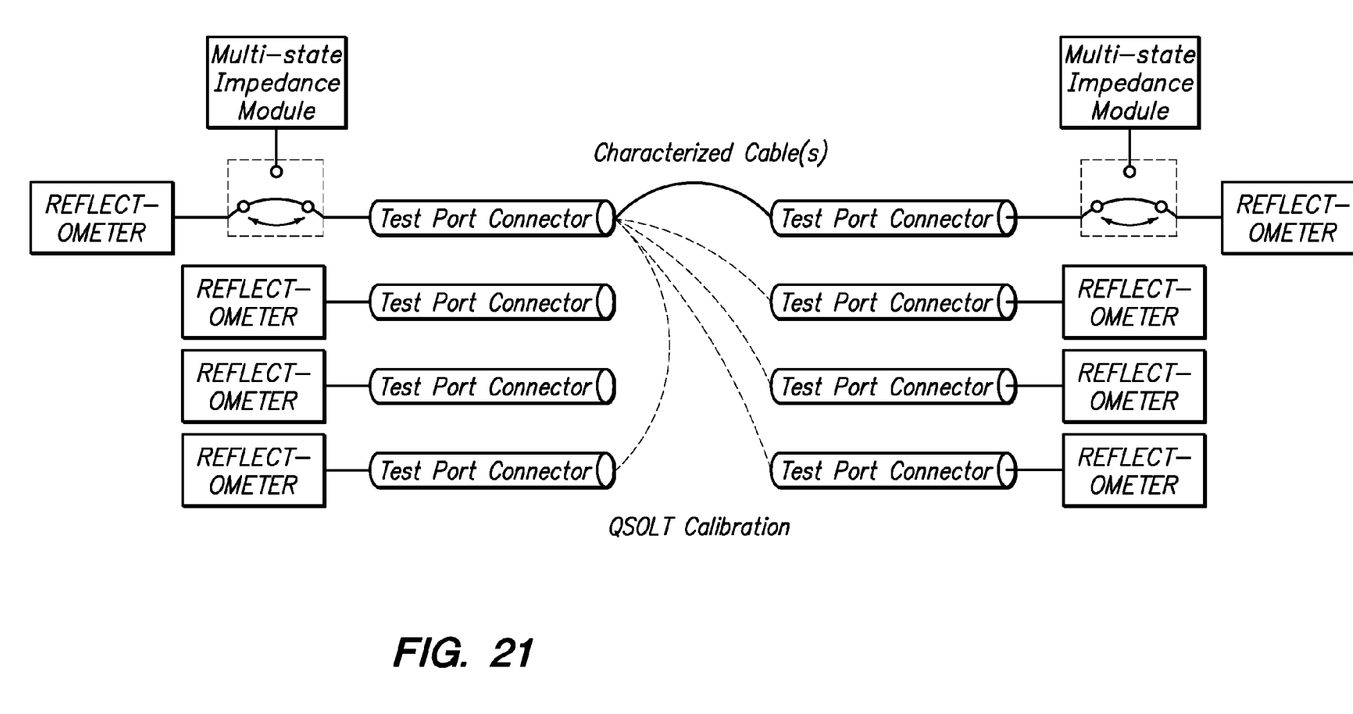
FIG. 21 illustrates automatic SOLT calibration.

FIG. 21 illustrates a functional block diagram of a vector network analyzer that requires no additional calibration standards.

$$[T_{E1}] = \begin{bmatrix} E_{S1}E_{D1} - E_{R1} & E_{D1} \\ -E_{S1} & 1 \end{bmatrix};\quad \text{Equation 13}$$

$$[T_{E2}] = \begin{bmatrix} E_{S2}E_{D2} - E_{R2} & E_{D2} \\ -E_{S2} & 1 \end{bmatrix}$$

$$[T_{c1}] = \left(\frac{1}{S_{21c1}}\right)\begin{bmatrix} \Delta S_{c1} & S_{11c1} \\ -S_{22c1} & 1 \end{bmatrix};$$

$$\Delta S_{c1} = S_{21c1}S_{12c1} - S_{11c1}S_{22c1}$$

$$[T'_{c2}] = \left(\frac{1}{S_{12c2}}\right)\begin{bmatrix} \Delta S_{c2} & S_{22c2} \\ -S_{11c2} & 1 \end{bmatrix};$$

$$\Delta S_{c2} = S_{21c2}S_{12c2} - S_{11c2}S_{22c2}$$

Note that cable-2, the second cable characterized as illustrated in FIG. 16, S-parameters are measured with the $S_{22}$ side connected to the test port.

The new load match and transmission tracking terms are:

$$\text{new\_load\_match\_forward} = E'_{L21} = S_{11c2} + \frac{S_{21c2}S_{12c2}E'_{L21}}{1 - S_{11c2}E'_{L21}}\quad \text{Equation 14}$$

$$\text{new\_load\_match\_reverse} = E'_{L22} = S_{22c1} + \frac{S_{21c1}S_{12c1}E'_{L12}}{1 - S_{11c1}E'_{L12}}$$

$E_{L21}$, $E_{L12}$ are the forward and reverse load match terms obtained in step 1 (shown in FIG. 6).

$$E'_{T21} = \frac{S_{21c1}S_{12c2}E_{T21}}{1 - S_{11c1}E_{S1} - S_{22c2}E_{L21}};\quad \text{Equation 15}$$

$$E'_{T12} = \frac{S_{12c2}S_{12c1}E_{T12}}{1 - S_{11c1}E_{L12} - S_{22c2}E_{S2}}$$

$E_{T21}$ and $E_{T12}$ are the forward and reverse transmission tracking terms obtained in step 1 (shown in FIG. 6). To transfer the measurement plane from the end of the cable to the test port can be derived by solving the $[T_{E1}]$, $[T_{E2}]$, $E_{L21}$, $E_{L12}$, $E_{T21}$, $E_{T12}$ terms from equation (13) through equation (15).

With the measurement planes transferred to the end of the cables, DUT measurement error correction may be handled in a standard VNA fashion.

We claim:

1. A method of calibrating an instrument, the method comprising:
   for an instrument having N ports, where N>=2,
   characterizing cables having a first type including,
   connecting a first cable between two of the N ports,
   performing an "unknown-thru" full two-port calibration between the two ports,
   obtaining a S-parameter of the first cable,
   saving the S-parameter of the first cable in an internal dedicated user memory, and
   repeating connecting, performing, obtaining and saving for additional cables having the first type;
   disconnecting the cables having the first type from one of the two ports and transferring a measurement plane from the connected end of the cable to the disconnected end of the cable; and
   characterizing cables having a second type including,
   connecting a second cable between the second of the two ports and the disconnected end of the first cable,
   measuring a S-parameter of the second cable, and
   saving the S-parameter of the second cable in the internal dedicated user memory.

2. A method as defined in claim 1, wherein the characterized cables are used to calibrate the remaining N-2 ports having a matable connector to the first or second cable, using the Short-Open-Load-Thru (SOLT) method.

3. A method as defined in claim 1, the instrument including:
   a signal source;
   a switch, connecting to the signal source and operable to connect to each of the N ports;
   each of the N ports connecting to a block that includes,
   a dual reflectometer having an input sensing arm connected to a reference receiver and an output sensing arm connected to a test receiver,
   a three terminal switch, having a first terminal connected to a reflectometer, a second terminal connected to a multi-state impedance module, and a third terminal connected to a test port connector.

4. A method as defined in claim 1, comprising correcting mismatch power measurements using power calibrated receivers and characterized cables and adapters.

5. A method of calibrating comprising:
   for an instrument having N ports, where N>=2 and the instrument includes,
   a signal source; and
   a source switch connecting to the signal source and operable to connect to each of the N ports;
   each of the N ports connecting to a block that includes,
   a power splitter, connected to the signal source, having a first splitter output connected to a reference channel receiver; and
   a second splitter output of the power splitter connected to the common pole of a single pole, N throw switch, each throw connected to a block including,
   a single reflectometer having input port connected to the source switch and an output arm connected to a test receiver,
   a three position switch, connected to the output port of the single reflectometer, connected to the test port connector,
   a multi state impedance module connected to the three position switch;
   connecting a cable of a characterized type between a first port and a second port with the signal source connected to the first port and the multi-state impedance module connected to the second port;
   performing a 1-port calibration at an end of the cable using the multi-state impedance connected to the second port;
   switching the second port to connection with the reflectometer instead of the multi-state impedance module; and measuring a thru connection to complete a 2-port calibration.

6. A method as in claim 5, when the multi-state impedance module is electrically connected to the test port connector, it is used for calibrating another port.

7. A method as in claim 5, when the multi-state impedance module is electrically connected to the test port connector, it is used as variable impedance termination for a device under test.

8. A method as defined in claim 5, comprising correcting mismatch power measurements using power calibrated receivers and characterized cables and adapters.

9. An instrument having N ports, where N>=2, comprising:
a signal source; and
a single pole, double throw switch, having a common pole connected to a second splitter output, each throw connected to a block including,
a three terminal switch, having a first terminal connected to a reflectometer, a second terminal connected to a multi-state impedance module, and a third terminal connected to a test port connector,
wherein the reflectometer is selected from a group including single and dual reflectometers.

10. An instrument as defined in claim 9, wherein the reflectometer is a single reflectometer, further including a power splitter, connected to the signal source, having a first splitter output connected to a reference channel receiver.

11. An instrument as in claim 9, when the multi-state impedance module is electrically connected to the test port connector, it is used for calibrating another port.

12. An instrument as in claim 9, when the multi-state impedance module is electrically connected to the test port connector, it is used as variable impedance termination for a device under test.

* * * * *